(12) United States Patent
Kato et al.

(10) Patent No.: US 6,639,924 B2
(45) Date of Patent: Oct. 28, 2003

(54) DRIVING MODULE OF LASER DIODE

(75) Inventors: Hiroshi Kato, Gifu (JP); Masato Asano, Nagoya (JP); Takuhiro Tani, Torrance, CA (US); Yasunori Iwasaki, Nishikasugai-Gun (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/036,753

(22) Filed: Dec. 21, 2001

(65) Prior Publication Data

US 2002/0167979 A1 Nov. 14, 2002

(30) Foreign Application Priority Data

Dec. 22, 2000 (JP) ........................................ 2000-391313
Dec. 22, 2000 (JP) ........................................ 2000-391324

(51) Int. Cl.[7] .................................................. H01S 3/00
(52) U.S. Cl. .................................. 372/38.02; 372/38.07
(58) Field of Search ........................ 372/38.02; 345/89; 327/325

(56) References Cited

U.S. PATENT DOCUMENTS

| 4,864,373 A | * | 9/1989 | Miyashita | .................... 327/325 |
| 5,748,164 A | * | 5/1998 | Handschy et al. | ............ 345/89 |
| 6,320,890 B1 | * | 11/2001 | Taguchi | .................... 372/38.02 |

* cited by examiner

*Primary Examiner*—Paul Ip
*Assistant Examiner*—Hung T Vy
(74) *Attorney, Agent, or Firm*—Burr & Brown

(57) ABSTRACT

A driving module for a laser diode has a submount substrate 1 for juxtaposing laser diodes 6, 6 and a driver IC 2. The driver IC 2 has an electric current switch circuit 3 for operating the laser diode 6, a output buffer circuit 4, and an input amplifying circuit 5. A power pattern 8 of a band shape is formed on the submount substrate 1 side by side with a line of the laser diodes 6. A connecting pad 14 for supplying an electric current to the electric current switch circuit 3 is arranged adjacent to a connecting portion with each laser diode 6. The operating electric current is supplied from this connecting pad 14 to the electric current switch circuit 3 by wire bonding.

11 Claims, 6 Drawing Sheets

DRIVING MODULE OF LASER DIODE

This application claims priority from Japanese Application 2000-391313 filed Dec. 22, 2000 and Japanese Application 2000-391324 filed Dec. 22, 2000, the entireties of which are incorporated herein by reference.

BACKGROUND OF THE INVENTION

The present invention relates to a driving module for a laser diode used in optical communication devices and the like, and particularly relates to a driving module equipped with a parallel laser array diode having a plurality of laser diodes. More particularly, it relates to an improvement in the power line connection between a driving driver IC and a laser diode.

As network transmission capacity represented by the Internet or mobile traffic increases, a demand for optical link throughput enhancement grows. In an optical transmission system, especially the type used in short-range situations, an optical parallel module having a laser diode array of a parallel multi-channel structure has recently been used.

A structure as shown in the block diagram of FIG. 6 is conventionally known as a transmission module used in such a case. This structure has a driving module for laser diodes of a parallel multichannel structure constructed by a submount substrate 35 on which a plurality of laser diodes 34, 34, are arranged side by side along with a driver IC 36.

A ceramic substrate is used in the submount substrate 35 to satisfy the heat radiation and electrical connection demands of the plurality of mounted laser diodes 34. An electric current is supplied to each laser diode 34 by a power pattern 37 juxtaposed with the line of laser diodes 34. Electric current supplying pads 37a, 37a are formed on left-hand and right-hand substrates at both ends of this power pattern 37. An electric current path is normally formed by wire bonding from a power line of a package on which the submount substrate 35 is mounted.

The driver IC 36 has an output buffer circuit 39 and electrical current switches 38, 38 . . . . The electrical current switch circuits function to turn on/off the electric current flowing through the laser diodes 34 in accordance with an input signal. Further, electric current supplying pads 40a, 40b, 40c, . . . are arranged for every circuit, and then the electric current is supplied to the driver IC 36 by connecting these pads to the power line of the package by wire bonding.

Thus, in the conventional power electric current supplying system used to supply both the laser diode and the electric current switch circuit, the electric current path flowing from the power line into the electric current switch circuit is usually different when the laser is turned on and off.

To improve a transmission data rate of an optical link module, the laser diode and the driver IC are important elements. However, when the transmission rate is high, a fluctuation of the laser driving electric current is often generated in the conventional construction. Such fluctuation causes time delay and phase delay of the laser diode current, and therefore a distortion of the waveform of an optical signal occurs. In particular, in the case of an array laser having a plurality of laser diodes arranged side by side, a change in the electric current (when turning on and off of the electric current) supplied to each laser diode is influenced by an adjacent channel operation, and causes a so-called electrical cross talk between adjacent laser diodes.

Concretely, in the case of an electric current supply as shown in FIG. 6, one example of the waveform of the laser driving current at a high operating speed is provided as shown in FIG. 7. Further, one example of the waveform of an applied voltage of the power pattern 37 of the submount substrate 35 is provided as shown by a characteristic curve B of FIG. 8. FIG. 7 shows one laser diode current waveform in a specific portion when adjacent other laser diodes are simultaneously operated. A curve P shows a case in which other portions are operated in a reverse phase (the other laser diodes are turned off), and a curve Q shows a case in which other laser diodes are operated in the same phase (the other laser diodes are also turned on). These curves show changes in the phase of the electric current waveform when the plural laser diode lines are simultaneously operated. The characteristic curve B of FIG. 8 shows a change in voltage (Vcc) of the power pattern 37 on the submount substrate 35 at a circuit operating time.

Thus, as a result of observations of the laser driving electric current waveform and the fluctuation of the voltage at the power pattern on the submount substrate, a rising time change and the phase delay of the laser diode current n were very large, depending upon a driving state (the same phase or the reverse phase) of the other adjacent laser channels. Accordingly, the signal waveform of the laser emitting light by this driving electric current is also seriously distorted, and this distortion has become an obstructing factor in the improvement of the transmission data rate. Further, when a time change of this driving electric current is caused, the applied voltage of the power pattern 37 on the submount substrate 35 is also greatly changed. This change causes the interaction between the channels. The time change of the laser electric current becomes notable in an NRZ (Not Return Zero) signal having a transmission speed of e.g., 2 Gbps or more, and a high speed signal line transmission of seven stages or more in PN, and has become a large factor of a transmission bit error occurrence.

In view of the above problems, an object of the present invention is to provide a driving module of a laser diode for reducing the time dependent change (waveform distortion and phase delay) of a driving electric current generated in the high speed operation of a laser diode, and reducing the interaction between respective channels and stably performing high speed signal transmission when multichannels are particularly set by mounting plural laser diodes.

With respect to the time dependent change (the waveform distortion and the phase delay) of the laser driving electric current, the inventors have ascertained a large cause of this time change. That is to say, from the results of the experiments, the time dependent change occurs because the electric current paths from a power source to a laser diode and to an electric current switch of a driver IC are different from each other.

Namely, the electric current switch of the driver IC plays a switching role of the electric current path with the laser diode as a load, and the electric current path in which a resistor arranged within the driver IC is set to a load. However, it has become clear that the time dependent change of the laser driving current supplied from the power source in accordance with various kinds of transmission signal lines is generated when the frequency of the electric current flowing through the electric current path is increased as the transmission rate is increased. Additionally, it has become clear that the time dependent change is caused by a difference between an electric impedance through a transmission line (e.g., a conductive pattern on the submount substrate and a connecting wire) to the laser diode, and an electric impedance through a transmission line to the load resistor arranged within the driver IC.

In a multichannel module arranging a plurality of laser diodes therein, the electric current paths to the arranged laser diodes individually have different electric impedances, and partially have a common path (e.g., the power pattern 37 formed on the submount substrate 35 described in FIG. 6). Therefore, it has become clear that these factors cause an increase in the cross talk (interaction) between the channels in which the laser driving electric current of a certain channel is influenced by another channel electric current having the common path.

SUMMARY OF THE INVENTION

To solve the above problems, one embodiment of the invention is characterized in that a driving module of a laser diode comprises a laser diode substrate mounting a plurality of laser diodes thereto; and a driver circuit substrate having electric current switch circuits for turning on/off the laser diodes; wherein a power line is juxtaposed with one of said laser diodes and one of said electric current switch circuits, and an electric current is supplied from the power line to both the laser diode and the electric current switch circuit.

In a preferred embodiment, a set of the laser diode and the electric current switch circuit for operating the laser diode receives the supply of electric current from approximately the same point on the power line. Preferably, a plurality of sets of laser diodes and electric current switch circuits are arranged, and each set receives the supply of electric current from approximately the same point.

The power line is a conductor pattern juxtaposed with the laser diode on the laser diode mounting substrate. Preferably, the electric current is supplied to the electric current switch circuit by extending the power line toward the electric current switch circuit from a portion close to a laser diode connecting portion of the power line, arranging a connecting pad at a tip of the power line, and making a wire bonding connection with the electric current switch circuit from the connecting pad.

In another embodiment, the electric current switch circuit has an ECL (Emitter Coupled Logic) circuit, and a constant electric current is approximately consumed even in a turning-off state of the laser diode.

In addition, a capacitor can be inserted between a ground point (GND) and approximately the same point of the power line from where the electric current to both the laser diode and the electric current switch circuit is supplied.

DETAILED DESCRIPTION OF THE INVENTION

Figure 1:
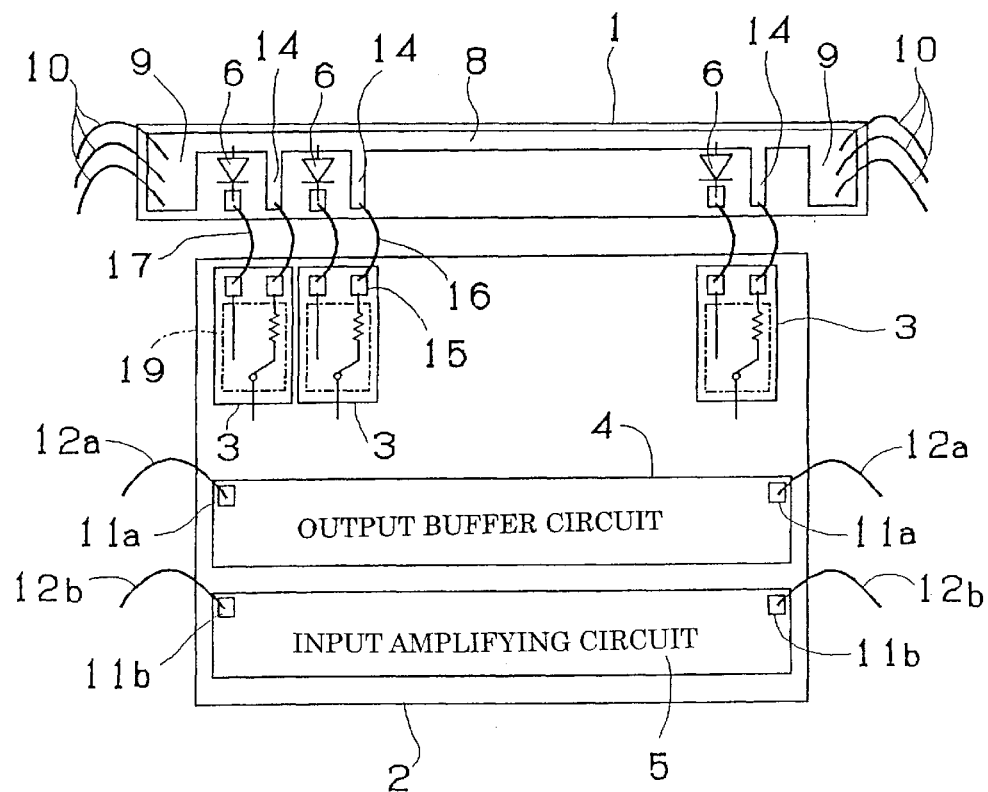
FIG. 1 is a block diagram showing one example of a driving module for a laser diode in accordance with the present invention.

FIG. 1 is a block diagram showing one example of a driving module for a laser diode in accordance with the present invention. Reference numeral 1 designates a submount substrate mounting laser diodes (hereinafter called LDs) 6, 6, . . . thereonto, and a driver IC2 for operating the LD 6. The driver IC 2 has an electric current switch circuit 3, an output buffer circuit 4, an input amplifying circuit 5, and the like, for operating the LD.

The submount substrate 1 is constructed by ceramic material, and the plural LDs 6, 6, . . . are aligned and mounted in one line. A power pattern 8 as a power line is adjacent to this line and is printed and formed on the substrate in parallel with the LD line. The power pattern 8 connects each LD 6 and supplies an operating electric current. Electric current supplying pads 9, 9 are respectively formed in the left-hand and right-hand portions shown in FIG. 1 and located outside both end portions of the LD line. The power pattern 8 is connected by a bonding wire 10 to an unillustrated power line within a package on which the submount substrate is mounted, and the electric current is supplied through the left-hand and right-hand two portions to the power pattern 8.

In the output buffer circuit 4, the input amplifying circuit 5, and the like, within the driver IC 2, plural electric current supplying pads 11a, 11b are arranged on every circuit, and are respectively connected to the power line within the package by bonding wires 12a, 12b.

The electric current switch circuit 3 is formed such that the electric current is supplied from the submount substrate 1 mounting the LD 6 thereto to the electric current switch circuit 3. The entire power pattern is formed in a sinking comb shape by extending the power pattern toward the electric current switch circuit 3 from a portion close to each LD connecting portion of the power pattern 8 formed in the submount substrate 1, and a connecting pad 14 is formed at a tip of this power pattern. This connecting pad 14 and an electric current supplying pad 15 on the electric current switch circuit 3 corresponding to each channel are connected to each other by wire bonding so as to receive the supply of electric current from the submount substrate 1.

This electric current switch circuit 3 is formed by an ECL (Emitter Coupled Logic) circuit 19, and is constructed such that a constant electric current is consumed at any time irrespective of turning-on/off operations of the LD 6 in each channel. Therefore, it is constructed such that the electric current supplied to the power pattern 8 becomes constant at any time irrespective of an operating state of LD 6.

Connecting each LD 6 and the electric current switch circuit 3 to each other by bonding wire 17 forms an LD operating circuit. Each connecting pad 14 and the electric current switch circuit 3 are connected by plural bonding wires in each channel together with the bonding wire 16 for supplying power from the electric current switch circuit 3.

Figure 2:
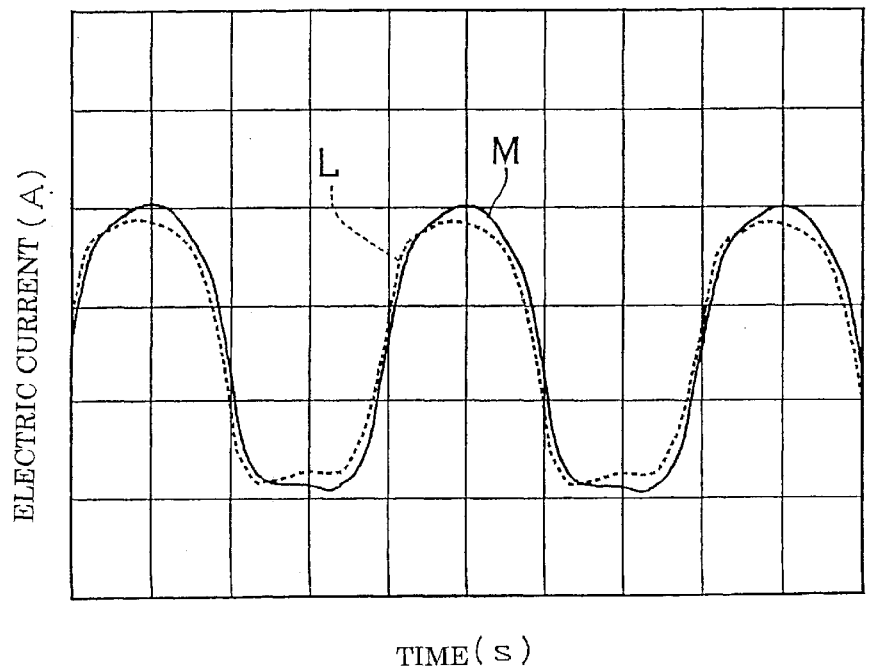
FIG. 2 is a driving electric current waveform in a laser diode of FIG. 1.
Figure 8:
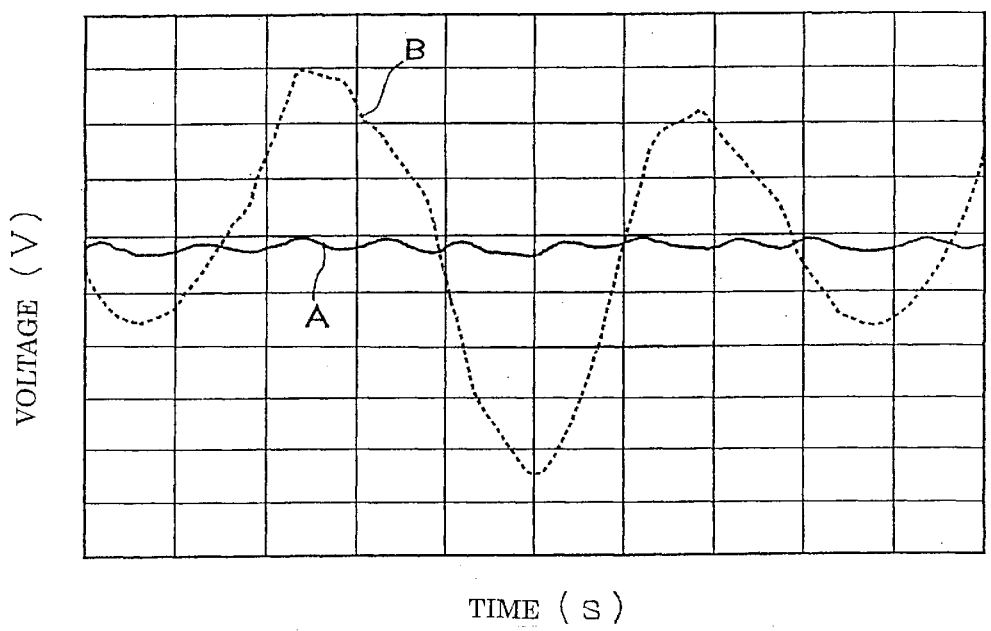
FIG. 8 is a view showing a change in voltage of a power line of a submount substrate in which a curve A shows characteristics of FIG. 1, and a curve B shows characteristics of the conventional driving module of the laser diode of FIG. 6.

FIG. 2 is a view showing a time dependent waveform in an LD driving electric current at this driving module of the laser diode, and shows the driving electric current waveform at a high speed operating time of one LD in a specific portion. A curve L shows a case in which the operation is performed in a reverse phase in another portion. A curve M shows a case in which the operation is performed in the same phase in another portion. These cases show a phase change of the electric current waveform when plural LDs are simultaneously operated. Further, a characteristic curve A of FIG. 8 shows a change in voltage of the power line on the submount substrate, i.e., a change in driving voltage of the LD 6, and also shows a change in voltage (Vcc) of the power pattern 8 on the submount substrate 1 at a circuit operating time.

As shown in these characteristic views, it is understood that almost no phase change of the electric current waveform is generated even at a simultaneous operating time of the plural laser diodes, and the change in the driving voltage is greatly reduced.

Thus, since the operating power line of the electric current switch circuit 3 and the power line for operating the LD line are commonized, it is possible to commonize the impedance of a power switch circuit block as a driver circuit substrate, and the impedance of a line path of an LD block arranged on the submount substrate 1 as a laser diode substrate. Further, since the electric current flowing through the power pattern 8 is approximately a constant electric current in any LD state, i.e., in any one of on/off timings, the variation of time delay of the LD driving current can be reduced.

Accordingly, as mentioned above, the time dependent change of an optical signal pulse emitted from each channel and the interaction (cross talk) between channels can be reduced even when a multichannel structure is formed by arranging plural LDs. Thus, the operation of the LD can be stabilized and a transmission band can be set to be higher and wider so that transmission rate can be improved.

Further, the connected bonding wire can be shortened and an impedance component of the wire can be reduced since the bonding pad 14 for connecting the power pattern 8 and the electric current switch circuit 3 is formed between the LDs, i.e., in the vicinity of the electric current switch circuit 3.

Figure 3:
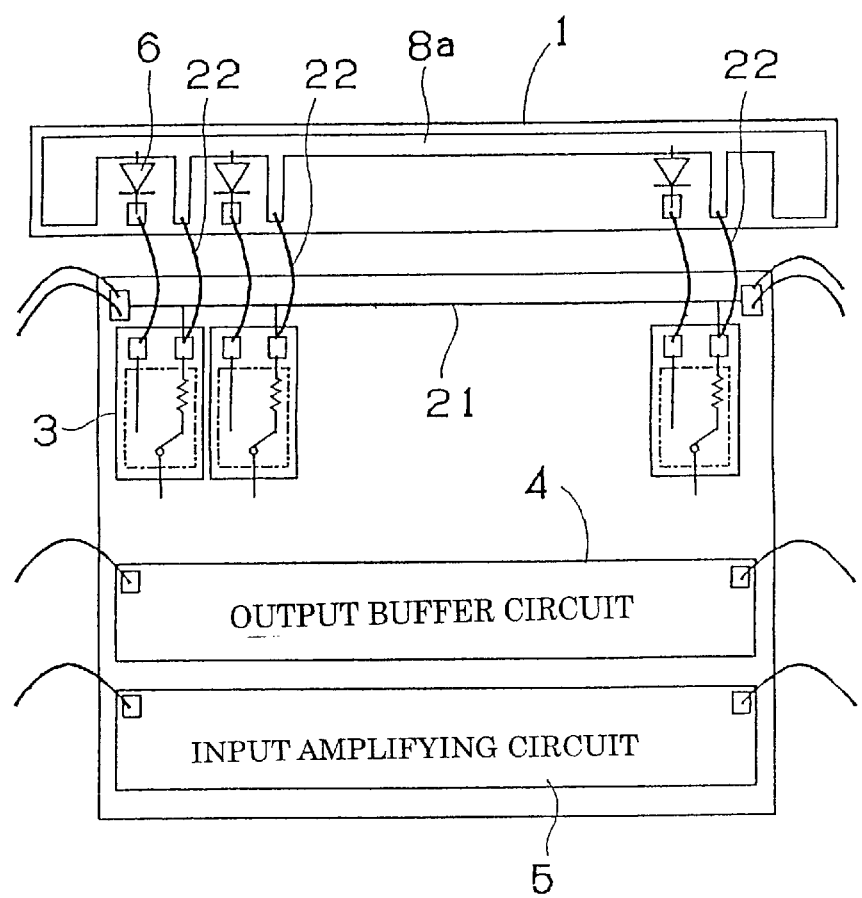
FIG. 3 is a block diagram of a driving module for a laser diode showing another embodiment of the present invention.

FIG. 3 is a block diagram showing another embodiment of the present invention. This embodiment differs from the first embodiment in an electric current supplying mode to the LD and the electric current switch circuit. In FIG. 3, a first power pattern 8a for supplying the electric current to the LD 6 is arranged on a submount substrate 1, and a second power pattern 21 is also juxtaposed within a driver IC adjacent to a line of electric current switch circuits 3. An operating electric current is supplied from this second power pattern 21 to each electric current switch circuit 3. Further, the first power pattern 8a is not directly connected to a power source, but is connected to the second power pattern 21 by bonding wires 22, 22, . . . . Left-hand and right-hand end portions of the second power pattern 21 are connected to a power line of a package so as to receive the supply of the electric current.

In the connection of the first power pattern 8a and the second power pattern 21, portions corresponding to the respective channels are connected by the wire bonding, and the driving electric current is supplied to each corresponding LD 6 from a portion near an electric current supplying point of the electric current switch circuit 3.

Thus, the electric current may be also supplied from the power pattern to the electric current switch circuit and the LD by arranging this power pattern on a side of the electric current switch circuit so that effects similar to those in the first embodiment can be obtained.

In this case, it is not necessary to form the first power pattern 8a in a continuous band shape over each LD, but the first power pattern 8a may be also formed in an independent pattern adjacent every LD.

Figure 4:
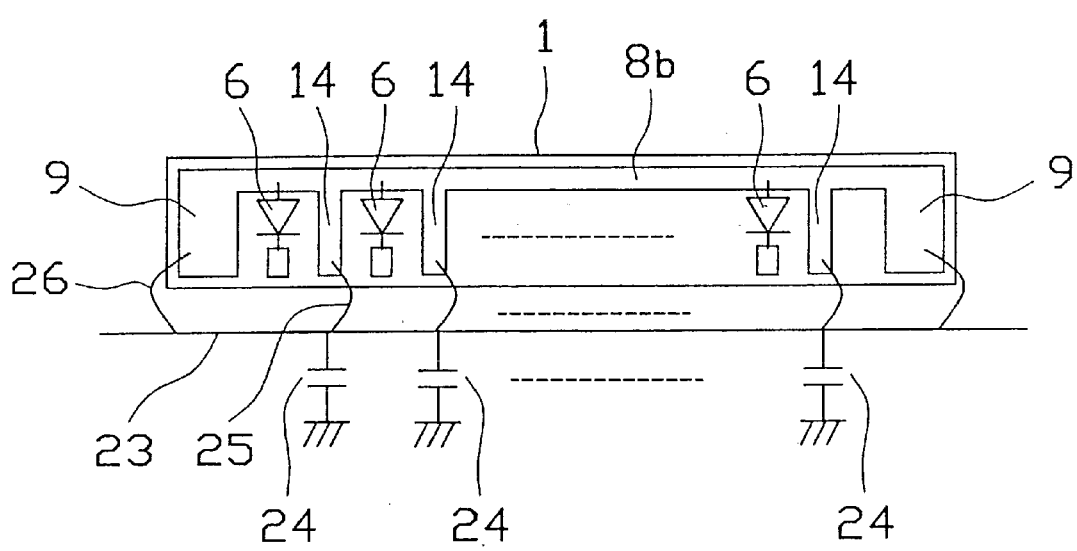
FIG. 4 is a block diagram of a laser diode substrate showing another embodiment of the present invention in which a capacitance is inserted between a ground point and one point of a power line which is supplying an electric current to both a laser diode and an electric current switch.

FIG. 4 is a block diagram showing another embodiment of the present invention, and shows only the submount substrate. Similar to the above embodiments, plural LDs 6, 6, . . . are mounted onto the submount substrate 1 in one line, and a power pattern 8b of a band shape is formed adjacent to this LD line, and a driving electric current is supplied to each LD 6. The power pattern 8b has an electric current supplying pad 9 in a position adjacent to each of left-hand and right-hand end portions of the LD line, and is connected to a power line 23 on a package side on which the submount substrate 1 is mounted by wire bonding.

A bonding pad 14 is formed in a sinking comb shape in a position adjacent to the LD 6, and each bonding pad 14 is connected to the power line 23 on the package side by the wire bonding so as to receive the supply of the electric current.

A capacitor 24 is arranged between each bonding pad 14 and the ground through an individual power pad on the connected package side. A plus pole of the capacitor 24 is connected to the bonding pad 14, and a minus pole of the capacitor 24 is connected to the ground.

Since the capacitor 24 is thus arranged in the vicinity of each LD 6 of the power pattern 8b, the LD driving electric current can be stabilized by supplying the electric current from the plus pole of the capacitor 24 to the LD 6 even if the LD driving electric current is changed. Further, there is also an effect for removing high frequency noise from the power line. Therefore, the change in the electric current at a high speed operating time of the LD can be effectively reduced in conformity with an increase in the number of bonding wires connected between the power pattern 8b on the substrate and the peripheral power line. Accordingly, the interaction between the LDs can be also reduced and a stable operation of the LD can be performed.

In this embodiment, the capacitor 24 is arranged in a connection portion with the power pattern on the package side, but may be also directly arranged on the LD substrate by arranging a dedicated connecting pad in the power line 8b of the submount substrate 1.

In the above embodiment, the bonding pad 14 as an electric current introducing point is arranged in each portion of the power pattern 8b corresponding to each LD 6, but it is not necessary to set the number of electric current introducing points to be equal to the number of LDs. For example, one electric current introducing point may be also arranged with respect to two LDs. It is also not necessary to arrange a capacitor at each electric current supplying point, but it is desirable to arrange the capacitor at each electric current supplying point in view of the stabilization of the electric current or a reduction in cross talk.

Figure 5:
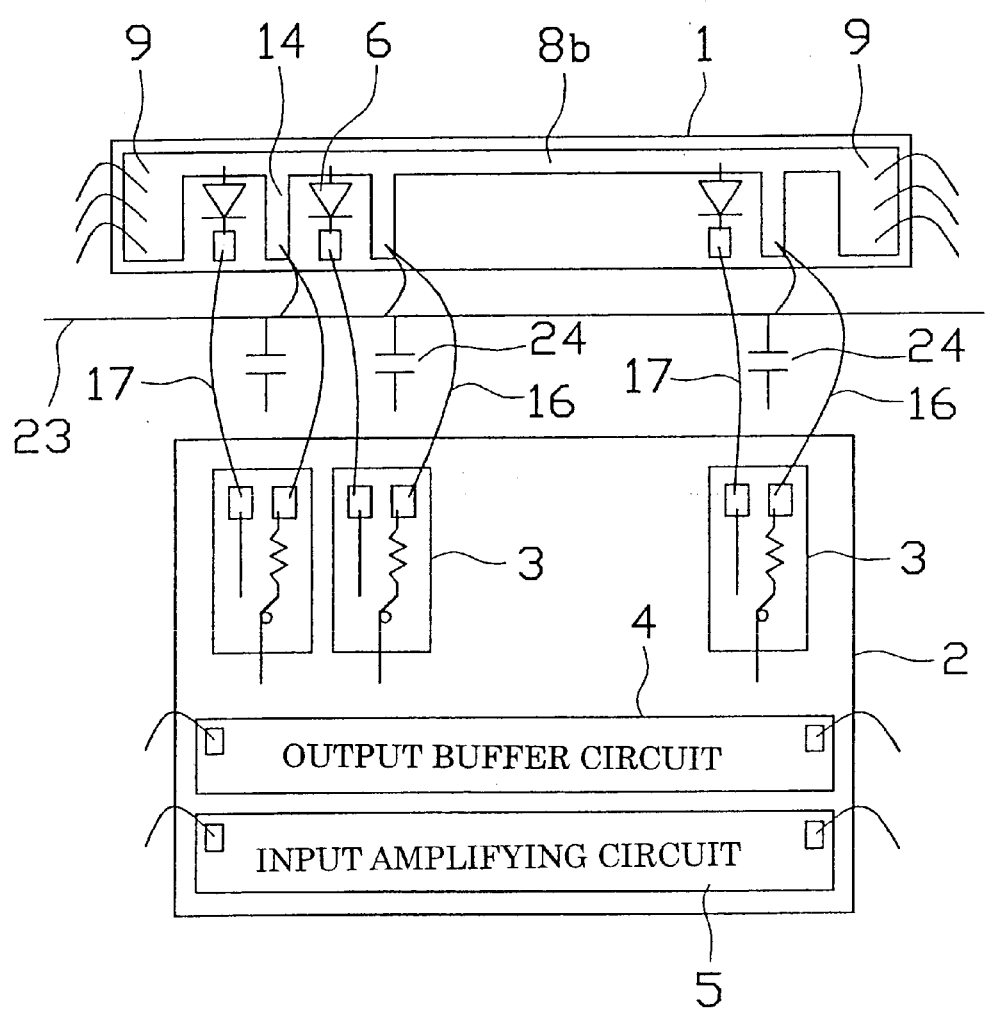
FIG. 5 is a block diagram of a driving module for a laser diode showing another embodiment of the present invention.
Figure 6:
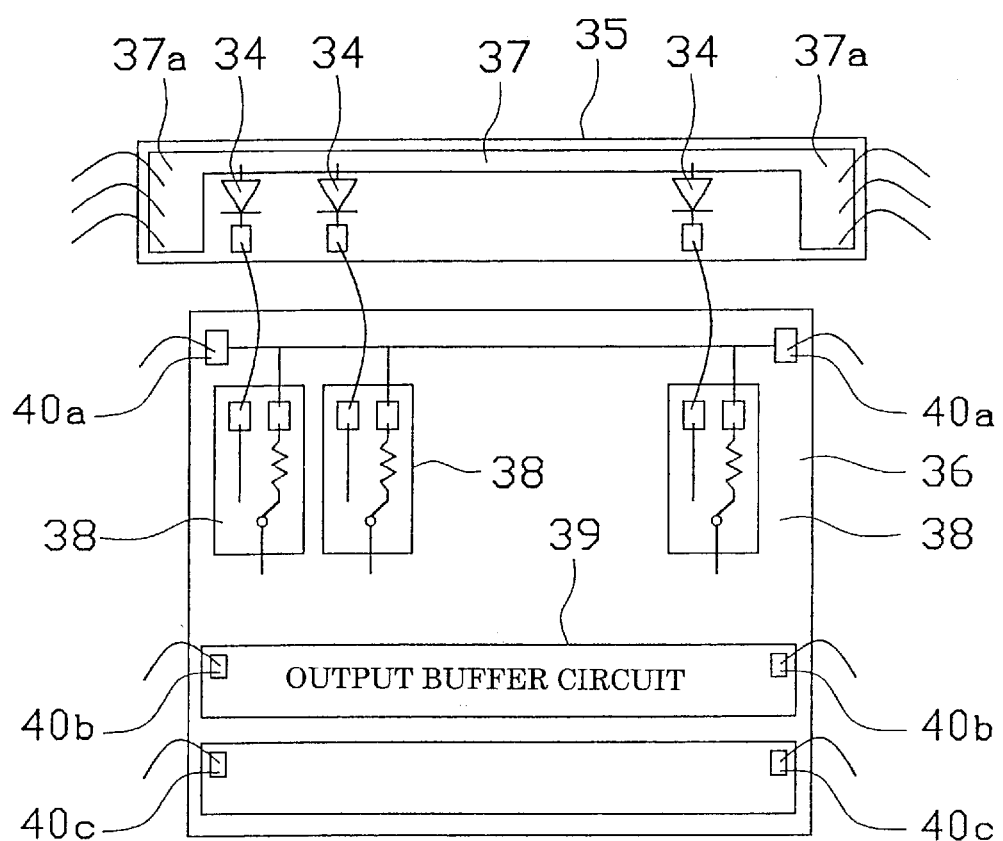
FIG. 6 is a block diagram of a conventional driving module for a laser diode.
Figure 7:
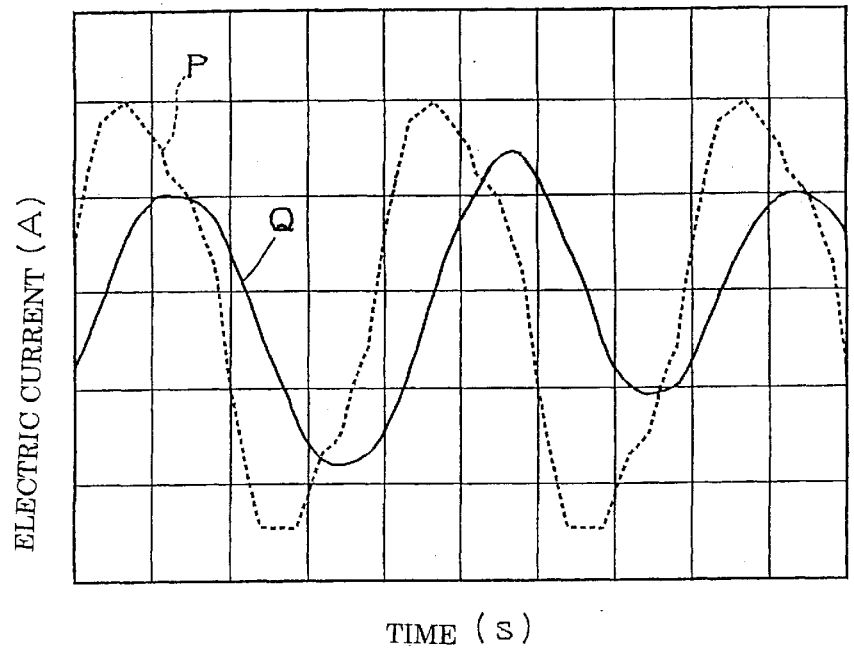
FIG. 7 is a driving electric current waveform diagram showing a change in a laser diode of FIG. 6. Curve P shows a LD current waveform when other channels are driving in the reverse phase, and curve Q shows a LD current waveform when other channels are driving in the same phase.

FIG. 5 shows another embodiment of the present invention, and also shows a block diagram when a capacitor is inserted between a ground point (GND point) and approximately the same point of the power line for supplying the electric current to the LD and the electric current switch. As shown in this figure, the construction of the submount substrate 1 is similar to that in FIG. 4. A capacitor 24 is inserted between the ground point and approximately the same point of a power pattern 8b for supplying the electric current to both each LD 6 and the electric current switch circuit 3. For example, a capacitance value of about a few hundred picofarads may be used in the capacitor 24 in view of an operating frequency, an electric current value, and the like.

Thus, by extending the power pattern for connection with the electric current switch circuit together with the common power line for every individual LD, and by connecting this extending power pattern and the electric current switch circuit to each other by the bonding wire, a constant electric current can be supplied to each electric current switch circuit at any time irrespective of turning-on/off times of the LD. Further, the electric current can be also reversely supplied to each LD from a side of the electric current switch circuit.

Effects of the construction of the present invention are notable when plural LDs are particularly simultaneously operated. Stability of the operating electric current of the LD and a reduction in cross talk as targets can be achieved by unifying the electric current supply to the LD and the electric current switch circuit turning on/off the LD, and arranging electric current supplying points in the vicinity of the LD and the electric current switch circuit. However, considerable effects are also obtained by using one factor of the present invention, e.g., only the submount substrate mounting the plural LDs thereto, i.e., by only a mode for arranging the electric current supplying point to each of the plural LDs. Accordingly, the electric current supplies to both the LD and the electric current switch circuit at the same point may be not necessarily provided in accordance with target quality.

Each of the above embodiments is explained in the context of multichannel module arranging a plurality of LDs therein, but can be also applied to a set of an LD of a single channel and an electric current switch.

Further, in the above embodiments, the electric current switch circuit is set to the ECL circuit, but another circuit mode may be also applicable if this circuit is a circuit in which the change in the electric current due to the turning-on/off operation is small.

As mentioned above in detail, in accordance with the present invention, each electrical impedance from the power line to the laser diode and to the electric current switch circuit can be commonized, the operation of the laser diode can be stabilized, and the transmission data rate can be improved. In addition, the interaction between channels can be reduced since the impedance of a line path to every channel can be also individually commonized even in a multichannel structure having plural laser diodes.

Further, since the connecting pad of the power line is formed near the electric current switch circuit, the connected bonding wire can be shortened and an impedance component (inductance) of the wire can be reduced.

Still further, the operating electric current of the electric current switch circuit at a turning-off time of the laser diode can be approximately set to the same electric current as the driving electric current of the laser diode, and there is no change in voltage of the power line caused by the turning-on/off operations of the laser diode. Therefore, a time dependent change in the driving electric current of the laser diode can be also reliably restrained together with the commonization of the line path impedance so that a transmission data rate band frequency can be set to be higher and wider.

In addition, high frequency switching noise caused by switching the electric current can be reliably reduced at an electric current supplying point, and it is possible to prevent the power line of another channel from being influenced by the noise in the case of a multichannel in which a set of the plural laser diodes and the electric current switch is arranged.

Description of the Reference Numerals and Signs

1—submount substrate, 2—driver IC, 3—electric current switch circuit, 6—LD (laser diode), 8—power pattern, 8a—first power pattern, 9—electric current supplying pad, 10—bonding wire, 11a, 11b—electric current supplying pad, 12a, 12b—bonding wire, 14—bonding pad, 15—electric current supplying pad, 16, 17—bonding wire, 19—ECL circuit, 21—second power pattern, 22—bonding wire, 23—power pattern, 24—capacitance, 25, 26—bonding wire.

What is claimed is:

1. A driving module for a laser diode comprising:

a laser diode substrate on which at least one laser diode is mounted, said laser diode being connected to a common power line; and a driver circuit substrate having an at least one electric current switch circuit for turning the laser diode on and off, said electric current switch circuit being connected to said common power line;

said common power line being formed on at least one of said laser diode substrate and said driver circuit substrate, such that electric current is supplied from the common power line to both the laser diode and the electric current switch circuit.

2. A driving module for a laser diode according to claim 1, wherein the laser diode and the electric current switch circuit form a set, and the set receives a supply of electric current from approximately the same point on the common power line.

3. A driving module for a laser diode according to claim 2, wherein a plurality of laser diodes and electric current switch circuits are provided in sets, and each set receives a supply of electric current from approximately the same point on the common power line.

4. A driving module for a laser diode according to claim 1, wherein the common power line is provided on the laser diode substrate and comprises a conductor pattern juxtaposed with the laser diode.

5. A driving module for a laser diode according to claim 2, wherein the common power line is provided on the laser diode substrate and comprises a conductor pattern juxtaposed with the laser diode.

6. A driving module for a laser diode according to claim 3, wherein the common power line is provided on the laser diode substrate and comprises a conductor pattern juxtaposed with the laser diode.

7. A driving module for a laser diode according to claim 4, wherein the common power line includes an extended portion that extends toward the electric current switch circuit from a portion close to a laser diode connecting portion of the common power line, a connecting pad is arranged at a tip of the extended portion, and a wire bonding connection is provided from the electric current switch circuit to the connecting pad.

8. A driving module for a laser diode according to claim 5, wherein the common power line includes an extended portion that extends toward the electric current switch circuit from a portion close to a laser diode connecting portion of the common power line, a connecting pad is stringed at a tip of the extended portion, and a wire bonding connection is provided from the electric current switch circuit to the connecting pad.

9. A driving module for a laser diode according to claim 6, wherein the common power line includes extended portions that extend from portions close to each of a plurality of laser diode connecting portions toward the electric current switch circuit corresponding to each laser diode, a connecting pad is arranged at a tip of each extended portion, and a wire bonding connection is provided from each electric current switch circuit to each connecting pad.

10. A driving module for a laser diode according to claim 1, wherein the electric current switch circuit comprises an ECL circuit, and a constant electric current is approximately consumed even in a turning-off state of the laser diode.

11. A driving module for a laser diode according to claim 1, further comprising a capacitor inserted between a ground point and approximately the same point of the common power line from where electric current is supplied to bath the laser diode and the electric current switch circuit.

* * * * *

UNITED STATES PATENT AND TRADEMARK OFFICE
CERTIFICATE OF CORRECTION

PATENT NO. : 6,639,924 B2 Page 1 of 1
DATED : October 28, 2003
INVENTOR(S) : Hiroshi Kato et al.

It is certified that error appears in the above-identified patent and that said Letters Patent is hereby corrected as shown below:

<u>Column 8,</u>
Line 17, please delete "an"
Line 60, please change "stringed" to -- arranged --

<u>Column 10,</u>
Line 4, please change "bath" to -- both --

Signed and Sealed this

Sixteenth Day of December, 2003

JAMES E. ROGAN
*Director of the United States Patent and Trademark Office*